United States Patent
Lee

(10) Patent No.: US 9,242,852 B2
(45) Date of Patent: Jan. 26, 2016

(54) WAFER-LEVEL PASSIVATION STRUCTURE OF MICRO-DEVICE, MICRO-DEVICE INCLUDING THE SAME, AND METHODS OF MANUFACTURING WAFER-LEVEL PASSIVATION STRUCTURE AND MICRO-DEVICE

(75) Inventor: Jeong-yub Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 456 days.

(21) Appl. No.: 13/562,968

(22) Filed: Jul. 31, 2012

(65) Prior Publication Data

US 2013/0052394 A1 Feb. 28, 2013

(30) Foreign Application Priority Data

Aug. 25, 2011 (KR) .......................... 10-2011-0085320

(51) Int. Cl.
*B81B 7/02* (2006.01)
*B81C 1/00* (2006.01)
*G02B 3/12* (2006.01)
*G02B 26/08* (2006.01)

(52) U.S. Cl.
CPC .............. *B81C 1/00269* (2013.01); *G02B 3/12* (2013.01); *G02B 26/0833* (2013.01); *B81C 2201/112* (2013.01); *B81C 2203/019* (2013.01); *B81C 2203/036* (2013.01); *Y10T 428/23* (2015.01); *Y10T 428/234* (2015.01)

(58) Field of Classification Search
CPC ................ B23B 3/28; B23B 3/12; B23B 3/26
USPC ...................................... 428/72, 68
See application file for complete search history.

(56) References Cited

U.S. PATENT DOCUMENTS

| 2009/0159200 A1* | 6/2009 | Rossi et al. ................... 156/292 |
| 2010/0046004 A1* | 2/2010 | Lee et al. ...................... 356/603 |

FOREIGN PATENT DOCUMENTS

| KR | 2003-0041028 A | | 5/2003 | |
| KR | 2009-0089611 A | * | 5/2003 | ............... G02B 7/04 |
| KR | 10-0747611 B1 | | 8/2007 | |
| KR | 10-2008-0043106 A | | 5/2008 | |
| KR | 2009-0089611 A | | 8/2009 | |
| KR | 2010-0048648 A | | 5/2010 | |
| KR | 2011-0023630 A | | 3/2011 | |

* cited by examiner

*Primary Examiner* — Brent O'Hern
(74) *Attorney, Agent, or Firm* — Harness, Dickey & Pierce, P.L.C.

(57) ABSTRACT

A wafer-level passivation structure of a micro-device, a micro-device including the same, and methods of manufacturing the wafer-level passivation structure and the micro-device may be provided. In particular, the passivation structure may include a spacer that is disposed on a substrate, covers a portion of the first surface, and has an elastic property, and an anti-adhesion layer that is disposed on a surface of the substrate between the spacer. The spacer may form a lattice pattern. The spacer may be formed of a silicon. The anti-adhesion layer may be a metallic film, an oxide film, or a nitride film.

13 Claims, 10 Drawing Sheets

PMDS : BEFORE OXYGEN PLASMA TREATMENT

PMDS : AFTER OXYGEN PLASMA TREATMENT

PMPS : BEFORE OXYGEN PLASMA TREATMENT

PMDS : AFTER OXYGEN PLASMA TREATMENT

WAFER-LEVEL PASSIVATION STRUCTURE OF MICRO-DEVICE, MICRO-DEVICE INCLUDING THE SAME, AND METHODS OF MANUFACTURING WAFER-LEVEL PASSIVATION STRUCTURE AND MICRO-DEVICE

CROSS-REFERENCE TO RELATED APPLICATIONS

This application claims the benefit of Korean Patent Application No. 10-2011-0085320, filed on Aug. 25, 2011, in the Korean Intellectual Property Office, the disclosure of which is incorporated herein in its entirety by reference.

BACKGROUND

1. Field

Example embodiments relate to micro-devices and/or methods of manufacturing the same, and in particular, to wafer-level passivation structures of a micro-device, micro-devices including the same, and/or methods of manufacturing the wafer-level passivation structures and the micro-devices.

2. Description of the Related Art

Micro electro mechanical system (MEMS) devices, micro-fluidic devices, or the like include driving portions. To protect the driving portions, a stack or packaging structure which provides spaces above the driving portions may be required.

Also, a micro-optical device including a lens module includes a driving portion, which allows a lens portion located at the center of the driving portion to be driven up and down to adjust a focal distance. Accordingly, to protect the driving portion, a package structure which provides space above the driving portion may be required.

To protect a driving portion of a MEMS device or a micro-fluidic device, packaging using a cap structure that has a cavity therein may be considered.

As a method of embodying this packaging structure, a wafer-level process suitable for a batch process, which is cost-effective and enables large-scale production, is desirable.

However, such a wafer-level packaging process may be susceptible to wafer warpage and may not be applicable to a structure that requires a low-temperature process.

SUMMARY

Some example embodiments provide passivation structures of a micro-device, which can tolerate wafer warpage occurring during a wafer-level packaging process.

Some example embodiments provide micro-devices including the passivation structures.

Some example embodiments provide methods of manufacturing the passivation structures and the micro-devices.

Additional aspects will be set forth in part in the description which follows and, in part, will be apparent from the description, or may be learned by practice of the presented example embodiments.

According to example embodiments, a passivation structure of a micro-device may include a substrate; a spacer on the substrate, the spacer having an elastic property, and an anti-adhesion layer on a portion of the substrate and surrounded by the spacer.

The spacer may form a lattice.

The spacer may include silicon.

The anti-adhesion layer may include a metallic film, an oxide film, or a nitride film.

The silicon may include polydimethylsiloxane (PDMS), polymethylphenylsiloxane (PMPS), or polyvinylsiloxane (PVS).

The metallic film may include titanium (Ti), chromium (Cr), aluminum (Al), tantalum (Ta), nickel (Ni), copper (Cu), gold (Au), platinum (Pt), tungsten (W), tin (Sn), vanadium (V), silver (Ag), or molybdenum (Mo).

The oxide film may include $Al_2O_3$, $TiO_2$, $Cr_2O_3$, $Ta_2O_3$, or LTO.

The nitride film may include TiN, AlN, CrN, or TaN.

According to example embodiments, a method of manufacturing a passivation structure of a micro-device may include forming a dangling bond on a surface of an elastic material film, forming an anti-adhesion layer on a portion of a first substrate, covering the anti-adhesion layer and the first substrate with the elastic material film having the dangling bond to bond the anti-adhesion layer and the first substrate to the elastic material film, and removing the elastic material film on the anti-adhesion layer.

The method of manufacturing a passivation layer may further include preparing of an elastic material film. The preparing of an elastic material film may include coating a fluorine film on a second substrate, treating the fluorine film-coated surface of the second substrate with an oxygen plasma, coating the elastic material film on the oxygen-plasma treated fluorine film, and solidifying the coated elastic material film.

The forming of a dangling bond may include treating the surface of the elastic material film with an oxygen plasma.

The elastic material film may include silicon.

Before the first substrate is bonded to the elastic material film, a surface of the first substrate may be treated with an oxygen plasma.

The anti-adhesion layer may include a metallic film, an oxide film, or a nitride film.

The covering the anti-adhesion layer may include covering the substrate with the elastic material film such that the elastic material film covers the anti-adhesion layer and contacts the substrate, and curing the first substrate covered with the elastic material film to further the bonding between the first substrate and the elastic material film.

The elastic material film formed on the anti-adhesion layer may be removed using a laser. Also, the anti-adhesion layer may be aligned in a lattice on the first surface of the substrate.

A region exposed surrounding the anti-adhesion layer may form a lattice pattern on the first substrate.

The substrate may include a silicon substrate or a silicon oxide substrate.

The base substrate may include a polyethylene terephthalate (PET) substrate. The curing may be performed at room temperature or a temperature higher than the room temperature.

According to example embodiments, a micro-device may include a device substrate including a driving portion, and the passivation structure described above covering the driving portion and coupled to the device substrate around the driving portion. The passivation structure in configured to not contact the driving portion.

The driving portion may include a micro electro mechanical system (MEMS) device or a micro-fluidic device having a liquid lens.

The device substrate may include a silicon-containing region around the driving portion and the passivation structure is bonded to the silicon-containing region. The silicon-containing region may include silicon or silicon oxide.

A side surface of the spacer may be covered by an epoxy.

According to example embodiments, a method of manufacturing a micro-device may include forming a device substrate including a driving portion; forming the passivation structure manufactured using the method described above, and bonding the passivation structure to the device substrate such that the passivation structure covers the driving portion without contacting the driving portion.

The bonding the passivation structure to the device substrate may include forming a dangling bond in a portion of the passivation structure that is to be bonded to the device substrate, and aligning the device substrate and the passivation structure.

Before the aligning, a portion of the device substrate to be bonded to the passivation structure may be treated with an oxygen plasma.

The portion of the device substrate to be bonded to the passivation structure may include silicon or silicon oxide.

After the passivation structure is bonded to the device substrate, a side of the elastic material film of the passivation structure may be covered by an epoxy.

A method of manufacturing a plurality of micro-devices having a passivation structure may include forming a device substrate including a plurality of driving portions surrounded by a material layer pattern, forming the passivation structure according to the method described above, bonding the passivation structure to the device substrate such that the elastic material film in the passivation structure is aligned to the material layer pattern in the device substrate and the passivation structure does is configured to not contact the driving portions, and dividing the device substrate into the plurality of micro-devices.

The dividing the device substrate into the plurality of micro-devices may include forming holes in the passivation structure between the driving portions to expose the material layer pattern, filling the holes with a filler; and separating the substrate through the filler into the plurality of micro-devices. Sides of the elastic material film of the passivation structure may be covered by the filler. The filler may be an epoxy The forming holes in the passivation structure may leave a portion of the elastic material film around the anti-adhesion layer.

The forming a device substrate may further include forming a thin film containing silicon on the material layer pattern when the material layer pattern does not contain silicon.

According to example embodiments, a passivation structure of a micro-device may include a substrate; a spacer on the substrate, the spacer having an elastic property, and an anti-adhesion layer on a portion of the substrate and surrounding at least a portion of the spacer.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
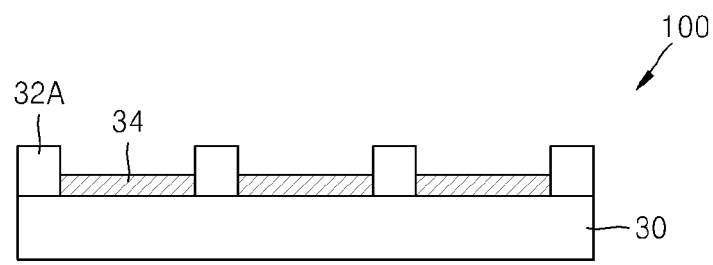
FIG. 1 is a cross-sectional view of a wafer-level passivation structure of a micro-device, according to an example embodiment.

Example embodiments will now be described more fully with reference to the accompanying drawings. In the drawings, widths and thicknesses of layers or regions may be exaggerated for clarity. The same reference numerals in the detailed description of the invention denote the same elements. In this regard, example embodiments may have different forms and should not be construed as being limited to the descriptions set forth herein. Accordingly, the embodiments are merely described below, by referring to the figures, to explain aspects of example embodiments.

Example embodiments will be explained in detail with reference to the attached drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, wafer-level passivation structures of a micro-device, micro-devices including the wafer-level passivation structures, and methods of manufacturing the wafer-level passivation structures and the micro-devices, according to example embodiments will be described with reference to the accompanying drawings.

First, a wafer-level passivation structure (hereinafter referred to as a passivation structure) of a micro-device according to an example embodiment will be described in detail.

Referring to FIG. 1, a passivation structure 100 may include a plurality of spacers 32A spaced apart from each other on a substrate 30. The spacers 32A may be bonded to the substrate 30 by a covalent bond. The substrate 30 may be a silicon-containing substrate. For example, the substrate 30 may be a silicon substrate or a silicon oxide substrate. In this case, the silicon oxide substrate may be, for example, a $SiO_2$ substrate. The spacers 32A may be a silicon spacer. For example, the spacers 32A may be formed of polydimethylsiloxane (PDMS), polymethylphenylsiloxane (PMPS), or polyvinylsiloxane (PVS). Each of the spacers 32A may have a height that is appropriate for its function. For example, in the event that a space between adjacent spacers 32A is disposed to face a driving portion of a micro-device typically having a three-dimensional structure, the spacers 32A may have a height such that the driving portion does not contact with any elements present in the space between spacers 32A. An anti-adhesion layer 34 is formed on a portion of the substrate 30 between spacers 32A. The anti-adhesion layer 34 may completely cover a portion of the substrate 30 surrounded by the spacers 32A. The anti-adhesion layer 34 prevents the spacers 32A from contacting with the substrate 30 disposed under the anti-adhesion layer 34, thereby allowing the spacers 32A to be formed only on a desired (or, alternatively a predetermined) region of the substrate 30. That is, the shape of the spacers 32A is determined according to a shape or pattern of the anti-adhesion layer 34. Accordingly, the spacers 32A may be formed in various plane shapes by patterning the anti-adhesion layer 34 in various shapes. The anti-adhesion layer 34 may be, for example, a metallic film, an oxide film, or a nitride film. The metallic film may be, for example, a metallic film including titanium (Ti), chromium (Cr), aluminum (Al), tantalum (Ta), nickel (Ni), copper (Cu), gold (Au), platinum (Pt), tungsten (W), tin (Sn), vanadium (V), silver (Ag), or molybdenum (Mo). The oxide film may be, for example, an oxide film including $Al_2O_3$, $TiO_2$, $Cr_2O_3$, $Ta_2O_3$, or LTO. The nitride film may be a film including TiN, AlN, CrN, or TaN.

Figure 2:
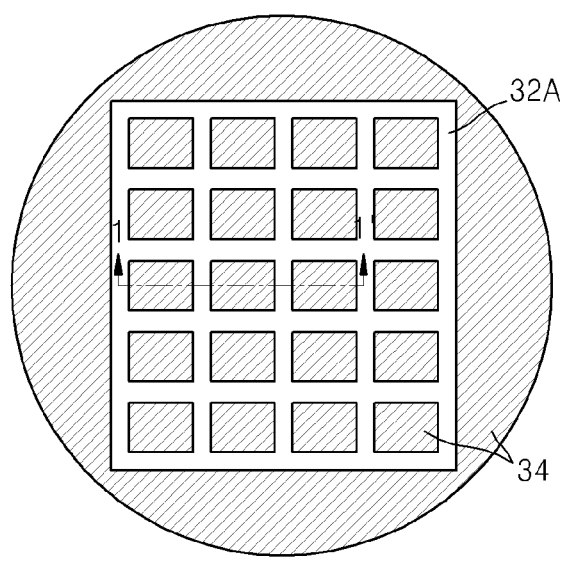
FIG. 2 is a plan view of the wafer-level passivation structure of FIG. 1.

FIG. 2 is a plan view of the passivation structure 100 of FIG. 1. FIG. 1 is a cross-sectional view taken along a line 1-1' of FIG. 2.

Referring to FIG. 2, the spacers 32A may constitute a lattice frame including a plurality of unit lattices.

Figure 3:
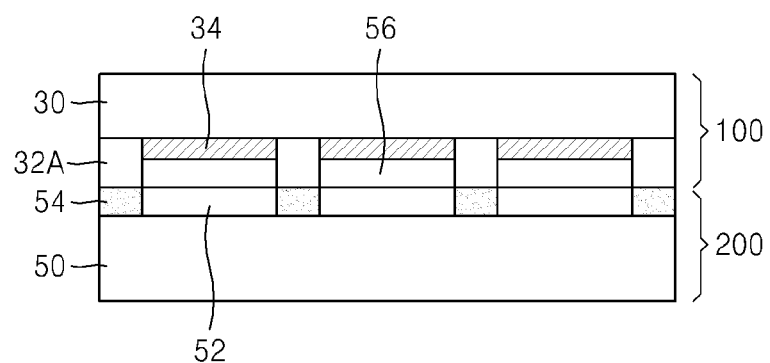
FIG. 3 is a cross-sectional view of a micro-device including a wafer-level passivation structure, according to an example embodiment.

FIG. 3 is a cross-sectional view of a micro-device including the passivation structure 100, according to an example embodiment.

Referring to FIG. 3, the micro-device according to an example embodiment may include a device substrate 200 including a driving portion or a driving element and the passivation structure 100 for protecting the device substrate 200. The device substrate 200 includes a substrate 50 and a driving portion 52 formed on the substrate 50. An adhesion layer 54 that contacts the passivation structure 100 is formed on a portion of the substrate 50 that is to surround the driving portion 52. The adhesion layers 54 may be located at intervals on the substrate 50 and the driving portion 52 may be formed on a portion of the substrate 50 between the adhesion layers 54. The adhesion layer 54 may be covalently bonded to the spacers 32A of the passivation structure 100. The adhesion layer 54 may be a material layer including silicon, for example, a silicon layer or a silicon oxide layer. The driving portion 52 may include a micro electro mechanical system (MEMS) device or an anchor included in the MEMS device. Also, the driving portion 52 may include a driving portion of a micro-fluidic device, for example, a tunable liquid lens portion. Also, if the device substrate 200 is an optical device, the optical device may include a lens module. In the lens module, intervals among the respective lenses need to be uniform. Accordingly, accurately aligned uniform spacers may be needed. The spacers 32A of the passivation structure 100 are formed at uniform intervals when manufacturing the spacers 32A, and if the spacers 32A are formed of an elastic material, the spacers 32A may have about 100% of restoring force. Accordingly, after a dicing process, the resultant spacers 32A on unit products may be able to maintain a desired (or, alternatively a predetermined) line width and height. One driving portion 52 may be a unit micro-device product. FIG. 3 illustrates an array of a plurality of unit micro-devices on the substrate 50. An optical device or a micro-device that may be included in the driving portion 52 is described in detail in Korean Patent Application Nos. 10-2006-0111723 or 10-2006-0021670.

Consequentially, by bonding the adhesion layer 54 to the spacers 32A of the passivation structure 100, a space 56 is formed above the driving portion 52. The space 56 may be a physical motion region of a driving element, for example, a lens, located in the driving portion 52.

As described above, a passivation structure of a micro-device according to an example embodiment is coupled to a driving portion via an elastic material spacer. Accordingly, in a final unit product, the height of the elastic material spacer may be maintained at a certain level due to its restoring force.

Also, the elastic material spacer and an anti-adhesion layer may be bonded to each other by using a laser. Accordingly, the elastic material spacer may be uniformly formed and accurately arranged. By doing so, the driving portion of the micro-device may be effectively protected.

Also, for example, the elastic material spacer formed of PDMS has an excellent waterproofness and anti-chemical properties, and a side surface of the elastic material spacer may be covered with an epoxy. Accordingly, permeation of water or harmful chemical materials may be prevented in a final product as well as during process.

Also, the elastic material spacer is an elastic body, and thus may be shrinkable and expandable. Accordingly, when the passivation structure is bonded to the driving portion of the micro-device, warpage of a substrate wafer on which the driving portion is formed may not affect the bonding.

Hereinafter, a method of manufacturing a wafer-level passivation structure, according to an example embodiment, will be described in detail.

Figure 4:
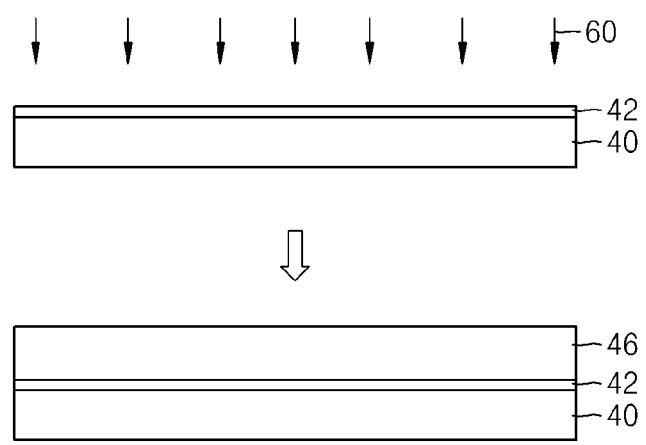
FIGS. 4, 5, and 8-11 are cross-sectional views illustrating a method of manufacturing a wafer-level passivation structure, according to an example embodiment.

Referring to FIG. 4, a fluorine film 42 may be coated on a base substrate 40. The base substrate 40 may be an elastic substrate formed of, for example, a polyethylene terephthalate (PET). The base substrate 40 on which the fluorine film 42 is to be coated is treated with an oxygen ($O_2$) plasma 60. Subsequently, an elastic material layer 46 is formed on the fluorine film 42. The elastic material layer 46 may be, for example, a PDMS, PMPS, or PVS layer. The elastic material layer 46 may be formed by coating a liquid elastic material on the fluorine film 42, followed by controlling a thickness of the elastic material by using, for example, a roller and heating the resultant material. Due to the treatment with the oxygen plasma 60, the liquid elastic material may be uniformly coated on the fluorine film 42 without agglomeration. The heating may be performed at a desired (or, alternatively a predetermined) temperature, for example, 100° C. or higher. Due to the heating, the coated liquid elastic material is solidified, thereby forming the elastic material layer 46. The elastic material layer 46 is temporarily attached to the substrate 40 due to the fluorine film 42. Accordingly, the substrate 40 may be easily separated from the elastic material layer 46 in a subsequent process by using, for example, an adhesive tape.

Figure 5:
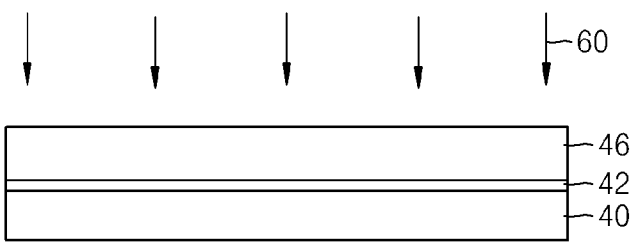

Then, as illustrated in FIG. 5, an upper surface of the elastic material layer 46 may be treated with the oxygen plasma 60. Thus, a hydroxyl group (—OH) or a dangling bond formed by breaking a chain is formed on the upper surface of the elastic material layer 46 treated with the oxygen plasma 60. As a result, the upper surface of the elastic material layer 46 is reformed from a hydrophobic property to a hydrophilic property and the surface of the elastic material layer 46 has a higher surface energy.

Figure 6:
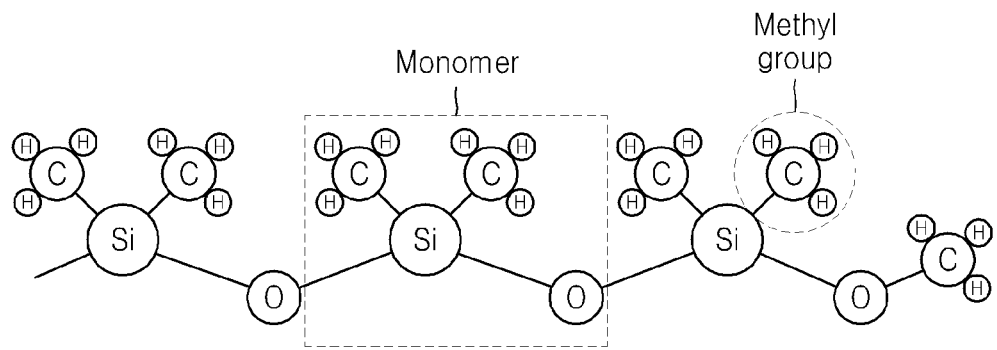
FIG. 6 shows a chemical structural change of PDMS before and after an oxygen plasma treatment is performed.
Figure 6:
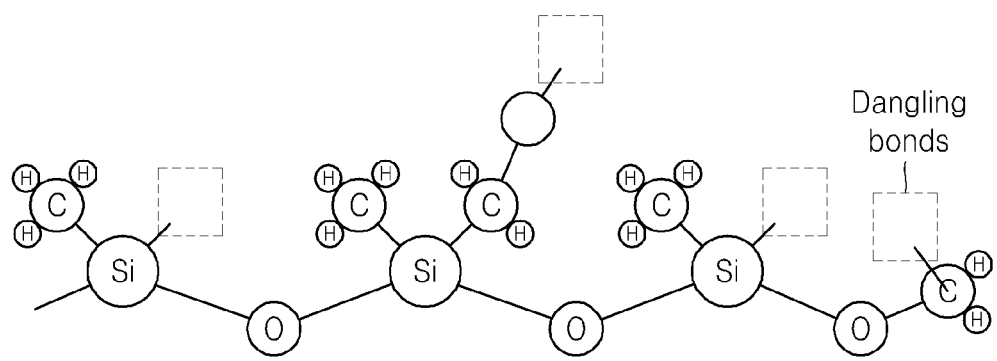

FIG. 6 shows chemical structures of the elastic material layer 46 before and after the oxygen plasma treatment when the elastic material layer 46 is formed of PDMS. Referring to FIG. 6, some methyl groups ($CH_3$) bonded to a silicon atom (Si) are released after the oxygen plasma treatment, thereby leaving dangling bonds indicated by dashed line boxes.

Figure 7:
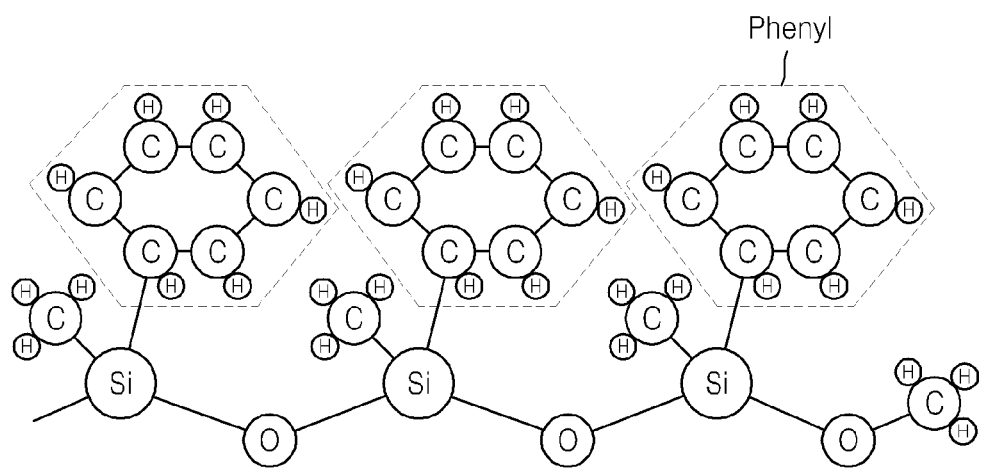
FIG. 7 shows a chemical structural change of PMPS before and after an oxygen plasma treatment is performed.
Figure 7:
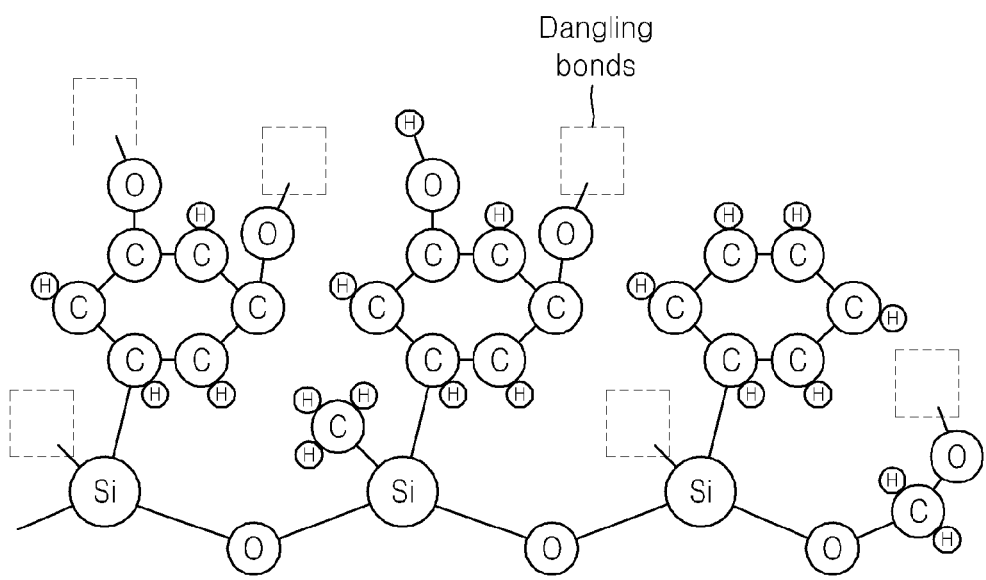

FIG. 7 shows chemical structures of the elastic material layer 46 before and after the oxygen plasma treatment when the elastic material layer 46 is formed of PMPS. Referring to FIG. 7, it is confirmed that dangling bonds is formed after the oxygen plasma treatment.

Figure 8:
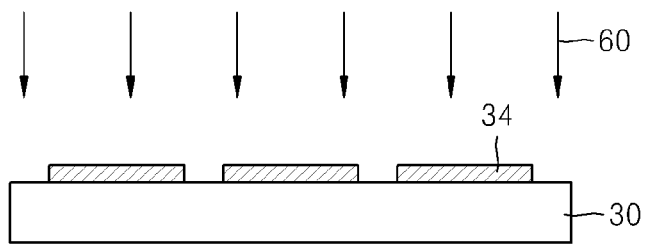

Referring to FIG. 8, a plurality of anti-adhesion layers 34 may be formed on the substrate 30. The anti-adhesion layers 34 are spaced apart from each other, and overall, the anti-adhesion layers 34 may be aligned such that a region exposed between the anti-adhesion layers 34 of the substrate 30 forms a lattice frame. An upper surface of the substrate 30 on which the anti-adhesion layers 34 may be formed is treated with an oxygen plasma 60. Due to the treatment with the oxygen plasma 60, a hydroxyl group (—OH) or a dangling bond may be formed on the upper surface of the substrate 30 by breaking a chain. The treatment with the oxygen plasma 60 on the substrate 30 may be optional.

Figure 9:
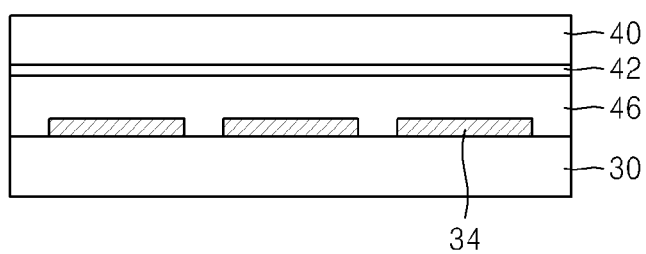

After the upper surfaces of the elastic material layer 46 and/or the substrate 30 are treated with the oxygen plasma 60 for about 30 minutes to 1 hour, as illustrated in FIGS. 5 and 8, the oxygen plasma treated structure of FIG. 5 and the oxygen plasma treated structure of FIG. 8 may be coupled to each other, for instance, by rolling, as illustrated in FIG. 9. In this case, the coupling is performed in such a way that the surface of the elastic material layer 46 treated with the oxygen plasma covers the anti-adhesion layer 34 and contacts the upper surface of the substrate 30 surrounding the anti-adhesion layer 34. After the coupling, the resultant structure is cured. The curing may be performed at room temperature for about 2 to 4 hours, for example 3 hours or longer. Also, at a temperature of 60° C., the curing may be performed for about 20 minutes to 2 hours, for example, 30 minutes or longer. Due to the curing, the surface of the elastic material layer 46 treated with the oxygen plasma is covalently bonded to the upper surface of the substrate 30 treated with the oxygen plasma and surrounds the anti-adhesion layer 34, thereby forming a strong permanent connection.

Figure 10:
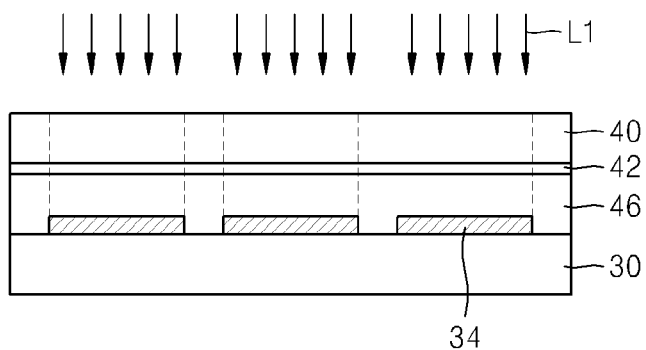
Figure 11:
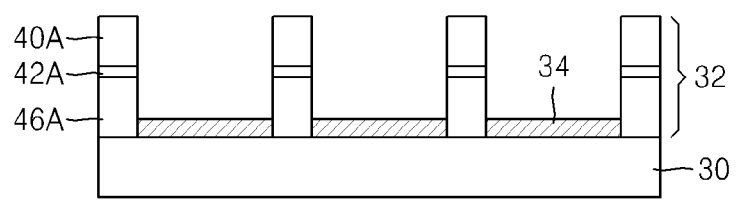

Then, as illustrated in FIG. 10, the resultant structure obtained by the curing may be processed with a laser L1 to remove portions of the elastic material layer 46, the fluorine film 42, and the base substrate 40 disposed on the anti-adhesion layer 34. The laser L1 may be irradiated along an edge of the anti-adhesion layer 34 rather than the whole surface of the anti-adhesion layer 34. The laser L1 may be, for example, a carbon dioxide ($CO_2$) laser. As a result of the irradiation of the laser L1, as illustrated in FIG. 11, a spacer layer 32, including the elastic material layer pattern 46A, the fluorine film pattern 42A, and the base substrate pattern 40A sequentially stacked on the portion of the substrate 30 surrounding the anti-adhesion layer 34, is formed. When the fluorine film pattern 42A and the base substrate pattern 40A are removed from the spacer layer 32 the passivation structure 100 of FIG. 1 including the spacers 32A formed of an elastic material on the substrate 30 is formed.

Hereinafter, a method of manufacturing a micro-device including a passivation structure, according to an example embodiment, will be described in detail.

Figure 12:
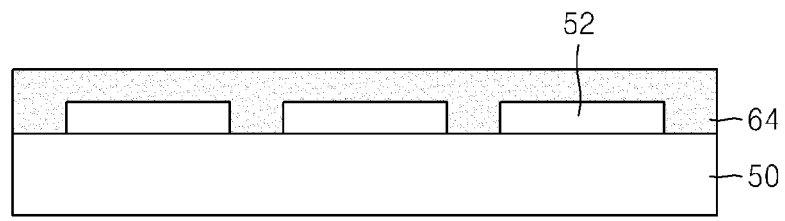
FIGS. 12-16 are cross-sectional views illustrating a method of manufacturing a micro-device including a wafer-level passivation structure, according to an example embodiment.
Figure 13:
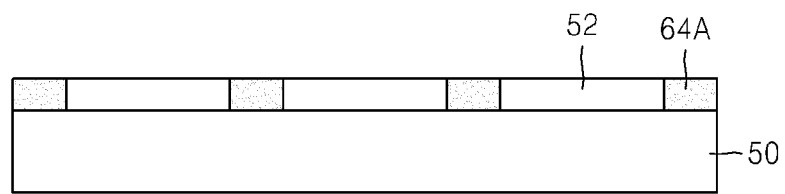

Referring to FIG. 12, the driving portion 52 of the micro-device may be formed on the substrate 50. The driving portion 52 may include a driving portion of an MEMS device or a driving portion of a micro-fluidic device. A material layer 64 may be formed on the substrate 50 to cover the driving portion 52. An upper surface of the material layer 64 is polished until the driving portion 52 is exposed. Due to the polishing, as illustrated in FIG. 13, a material layer pattern 64A is formed on a portion of the substrate 50 surrounding the driving portion 52. In this regard, the height of the material layer pattern 64A is the same as that of the driving portion 52. The material layer pattern 64A may correspond to the adhesion layer 54 of FIG. 3. The material layer 64 may be a material layer including silicon, for example, a silicon layer or a silicon oxide layer.

Figure 14:
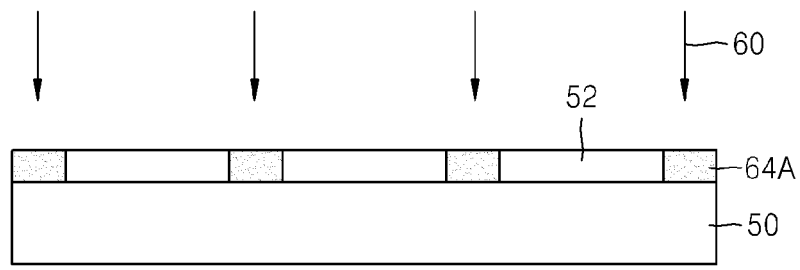
Figure 15:
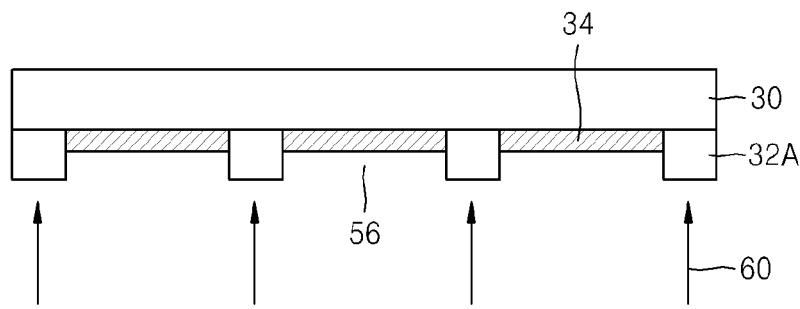
Figure 16:
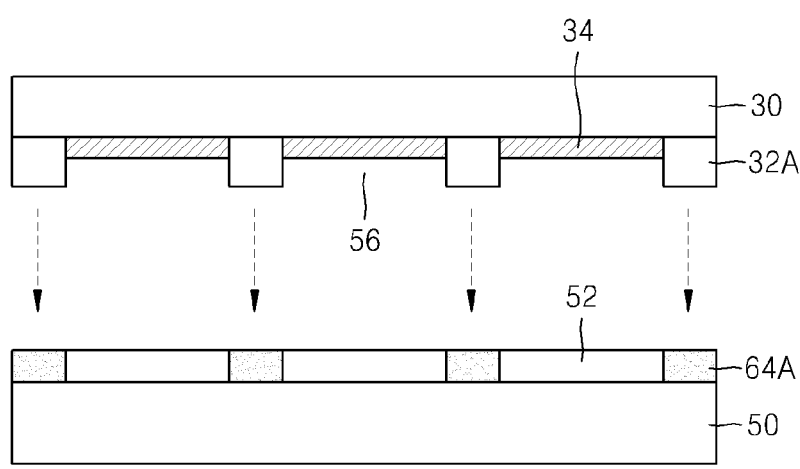

Then, as illustrated in FIG. 14, the material layer pattern 64A is treated with an oxygen plasma 60. The treatment with the oxygen plasma 60 may be optional. Accordingly, the treatment with oxygen plasma 60 may not be used. Subsequently, as illustrated in FIG. 15, surfaces of the spacers 32A of the passivation structure 100 which contact with the material layer pattern 64A may also be treated with the oxygen plasma 60, and then, as illustrated in FIG. 16, the passivation structure 100 and the substrate 50 are aligned in such a way that the spacers 32A of the passivation structure 100 correspond to the material layer pattern 64A formed on the substrate 50 and the spacers 32A are bonded to the material layer pattern 64A. The bonding may be performed in a vacuum atmosphere by compression bonding. As a result, the micro-device including the passivation structure 100 protecting the driving portion 52, as illustrated in FIG. 3, may be formed.

During the bonding, the substrate 50 may be slightly warped due to a stress generated during the formation of the driving portion 52 and until the material layer pattern 64A is formed after the formation of the driving portion 52 is formed and a thermal expansion coefficient difference generated between different materials to be bonded. Because the spacers 32A of the passivation structure 100 are formed of an elastic material and thus are shrinkable and expandable, the deformation of a bonding region due to the warpage of the substrate 50 may be tolerable. When the micro-device is divided into unit products, due to the elastic property of the spacers 32A, the spacers 32A that have been shrunken or expanded during bonding may be restored to its original shape. Accordingly, the spacers 32A of a plurality of unit products from the same substrate may have a uniform thickness. Thus, an interval between the substrate 50 and the substrate 30 of the passivation structure 100 may be maintained constant.

Figure 17:
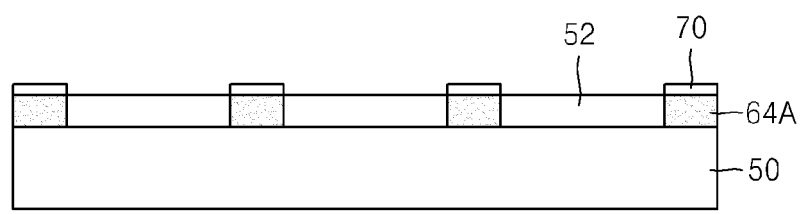
FIG. 17 is a cross-sectional view illustrating forming a silicon-containing thin film on a material layer pattern when the material layer pattern illustrated in FIGS. 12 to 16, does not contain silicon.

Referring to FIG. 17, when the material layer 64 does not contain silicon, a thin film 70 containing silicon may be formed on the material layer pattern 64A, and then the bonding process described above may be performed thereon together with the passivation structure 100. The thin film 70 may be formed by physical vapor deposition, such as sputtering or evaporation. In this case, to form the dangling bond, permeation of elements other than silicon (Si) and oxygen (O) may be prevented.

Figure 18:
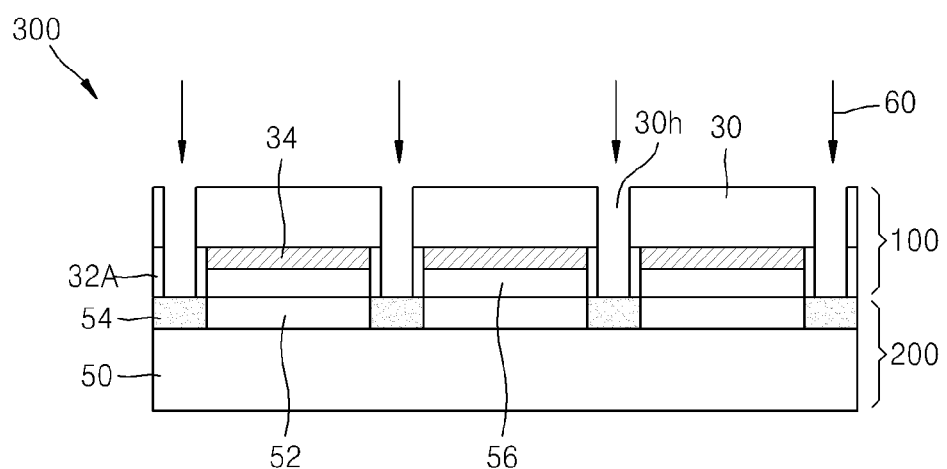
FIGS. 18 to 21 are cross-sectional views illustrating depositing epoxy on a side surface of a spacer of a unit micro-device according to an example embodiment.

Referring to FIG. 18, the micro-device 300 including the passivation structure 100 and a device substrate 200 may include a plurality of unit micro-devices. Accordingly, when the manufacture of the micro-device 300 is completed, the micro-device 300 is divided into unit micro-devices by dicing. In this case, to maximize a gas blocking effect of the spacers 32A of the passivation structure 100, the dicing may be performed as follows.

Referring to FIG. 18, first dicing may be performed to expose the adhesion layer 54. Due to the first dicing, portions of the spacers 32A and the substrate 30 on the adhesion layer 54 may be removed to form a hole 30h. Due to the first dicing, each of the spacers 32A between driving portions 52 may be divided into two portions. An exposed portion of the adhesion layer 54 and the two separated portions of each spacer 32A formed by the first dicing may be cleaned. After the cleaning, the exposed portions of the spacers 32A may be treated with the oxygen plasma 60.

Figure 19:
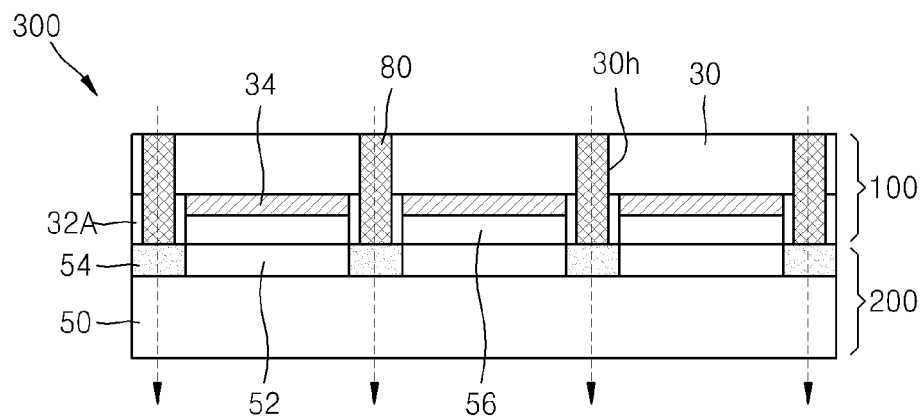
Figure 20:
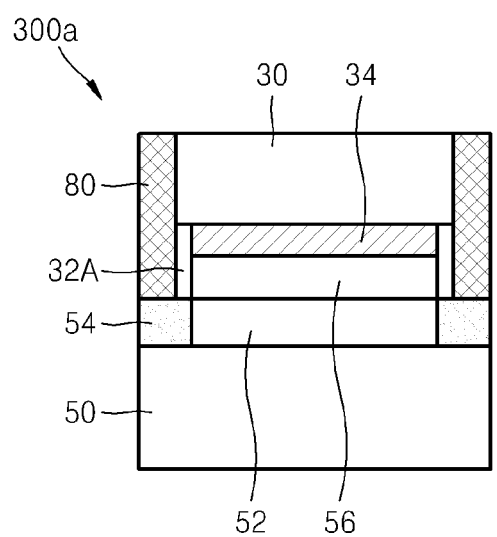

Then, as illustrated in FIG. 19, the hole 30h is filled with an epoxy 80 in a liquid state. To prevent formation of pores or a space between the epoxy 80 and the portion filled with the epoxy 80, the application process of the epoxy 80 may be performed in a vacuum atmosphere. The epoxy 80 may be an epoxy that is hardened by ultraviolet (UV) rays. For example, after the hole 30h is filled with the epoxy 80, the UV rays may be irradiated thereto to harden the epoxy 80 filling the hole 30h. Thereafter, second dicing is performed thereon to separate the substrate 50 into a plurality of unit micro-devices. The second dicing may be performed along the dashed line. As illustrated in FIG. 20, the unit micro-devices 300a obtained by the second dicing, includes the epoxy 80 covering the side of the spacers 32A. Thus, the permeation of gas, for example, air or micro particles through the spacers 32A may be prevented.

Figure 21:
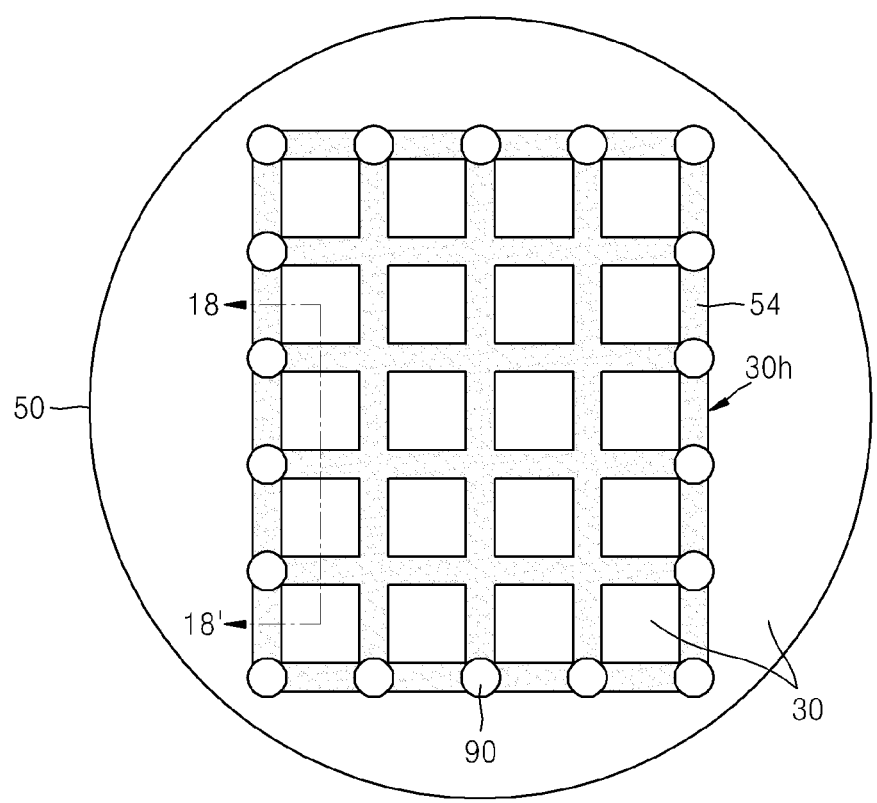

FIG. 21 is a plan view of the micro-device 300 of FIG. 18. FIG. 18 is a cross-sectional view of the micro-device of FIG. 21 taken along a line 18-18'.

Referring to FIG. 21, the hole 30h may constitute a lattice passage overall. Before the hole 30h is filled with the epoxy 80, an epoxy dam 90 may be formed at the same intervals as those of the lattice of the hole 30h along an edge of the lattice structure of the hole 30h. The epoxy dam 90 may block the passages of the epoxy 80 at opposite ends of each lattice passage of the hole 30h. The epoxy dam 90 may be formed in a vacuum atmosphere. After the epoxy dam 90 is formed as described above, the epoxy 80 is dropped to an inner region of the lattice structure of the hole 30h. The epoxy 80 dropped to the inner region of the hole 30h is dispersed due to a capillary force of the lattice structure to a whole region of the lattice structure of the hole 30h having outlets blocked by the epoxy dam 90, thereby filling the hole 30h as illustrated in FIG. 19. A viscosity of the epoxy dam 90 may be higher than that of the epoxy 80 dropped to the inner region of the hole 30h. For example, the viscosity of the epoxy dam 90 may be equal to or greater than 10,000 cst, and the viscosity of the epoxy 80 may be equal to or less than 100 cst.

As described above, in a method of manufacturing a micro-device including a passivation structure, according to an example embodiment, the bonding between the spacers in the passivation structure and the material layer pattern (or the adhesion layer) surrounding a driving portion may be performed even at room temperature. Also, because the bonding is embodied by a dangling bond, a strong bond (20 MPa or more) may be obtainable. Accordingly, this method may also be applied to a packaging process that requires a low temperature process, such as a process for forming a liquid lens.

Also, because the passivation structure is bonded to the micro-device by the dangling bond, contamination may not occur.

Also, because an elastic material for use as the spacer has a relatively wide temperature range for processing, e.g. a temperature of about −55° C. to 250° C., the elastic material may also be used in a high temperature process.

While example embodiments have been particularly shown and described with reference to exemplary embodiments thereof, it will be understood by those of ordinary skill in the art that various changes in form and details may be made therein without departing from the spirit and scope of the example embodiments as defined by the following claims. It should be understood that the exemplary embodiments described therein should be considered in a descriptive sense only and not for purposes of limitation.

What is claimed is:

1. A passivation structure of a micro-device, the passivation structure comprising:
   a substrate;
   a spacer on the substrate, the spacer having an elastic property; and
   an anti-adhesion film layer on a portion of the substrate and surrounded by the spacer,
   wherein the spacer forms a lattice.

2. The passivation structure of claim 1, wherein the spacer comprises silicon.

3. The passivation structure of claim 1, wherein the anti-adhesion film layer comprises a metallic film, an oxide film, or a nitride film.

4. The passivation structure of claim 2, wherein the silicon comprises polydimethylsiloxane (PDMS), polymethylphenylsiloxane (PMPS), or polyvinylsiloxane (PVS).

5. The passivation structure of claim 3, wherein the metallic film comprises titanium (Ti), chromium (Cr), aluminum (Al), tantalum (Ta), nickel (Ni), copper (Cu), gold (Au), platinum (Pt), tungsten (W), tin (Sn), vanadium (V), silver (Ag), or molybdenum (Mo).

6. The passivation structure of claim 3, wherein the oxide film comprises $Al_2O_3$, $TiO_2$, $Cr_2O_3$, $Ta_2O_3$, or LTO.

7. The passivation structure of claim 3, wherein the nitride film comprises TiN, AlN, CrN, or TaN.

8. A micro-device comprising:
a device substrate including a driving portion; and
the passivation structure of claim 1 covering the driving portion and coupled to the device substrate around the driving portion,
wherein the passivation structure is configured to not contact the driving portion.

9. The micro-device of claim 8, wherein the driving portion comprises a micro electro mechanical system (MEMS) device.

10. The micro-device of claim 8, wherein the driving portion comprises a micro-fluidic device including a liquid lens.

11. The micro-device of claim 8, wherein the device substrate comprises a silicon-containing region around the driving portion and the passivation structure is bonded to the silicon-containing region.

12. The micro-device of claim 11, wherein the silicon-containing region comprises silicon or silicon oxide.

13. The micro-device of claim 8, wherein a side surface of the spacer is covered by an epoxy.

* * * * *